(12) United States Patent
Jung et al.

(10) Patent No.: US 12,069,934 B2
(45) Date of Patent: Aug. 20, 2024

(54) DISPLAY DEVICE AND METHOD OF MANUFACTURING THE SAME

(71) Applicant: Samsung Display Co., Ltd., Yongin-Si (KR)

(72) Inventors: Woosuk Jung, Yongin-si (KR); Jaeheung Ha, Suwon-si (KR); Wonjong Kim, Suwon-si (KR); Jongwoo Kim, Hwaseong-si (KR); Heeyeon Park, Seoul (KR); Changyeong Song, Suwon-si (KR); Hyein Yang, Siheung-si (KR); Yongchan Ju, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 342 days.

(21) Appl. No.: 17/496,139

(22) Filed: Oct. 7, 2021

(65) Prior Publication Data

US 2022/0238851 A1    Jul. 28, 2022

(30) Foreign Application Priority Data

Jan. 27, 2021    (KR) .......................... 10-2021-0011433

(51) Int. Cl.
  *H10K 71/00* (2023.01)
  *H10K 50/844* (2023.01)
  *H10K 50/858* (2023.01)
  *H10K 102/00* (2023.01)

(52) U.S. Cl.
  CPC ........... *H10K 71/00* (2023.02); *H10K 50/844* (2023.02); *H10K 50/858* (2023.02); *H10K 2102/00* (2023.02); *H10K 2102/351* (2023.02)

(58) Field of Classification Search
  None
  See application file for complete search history.

(56) References Cited

U.S. PATENT DOCUMENTS

2018/0153006 A1*  5/2018  Ishida .................. H10K 50/844

FOREIGN PATENT DOCUMENTS

| CN | 111065514 B | * | 1/2022 | ............... B32B 9/00 |
|---|---|---|---|---|
| JP | 2002294451 A | * | 10/2002 | |
| JP | 2005339992 A | * | 12/2005 | |
| JP | 5723731 B2 |  | 5/2015 | |
| JP | 2016010889 A | * | 1/2016 | |
| JP | 2017147191 A |  | 8/2017 | |
| KR | 1020120109083 A |  | 10/2012 | |
| KR | 101474630 B1 |  | 12/2014 | |
| KR | 101829971 B1 |  | 2/2018 | |
| KR | 102113176 B1 |  | 5/2020 | |

* cited by examiner

*Primary Examiner* — Michael Lebentritt
(74) *Attorney, Agent, or Firm* — CANTOR COLBURN LLP (57) ABSTRACT

A method of manufacturing a display device includes forming a light emitting structure on a substrate and forming a thin film encapsulation layer on the light emitting structure by chemical vapor deposition equipment. The forming the thin film encapsulation layer includes forming a first inorganic layer and performing a first plasma treatment on a first portion of the first inorganic layer which is opposite to a second portion of the first inorganic layer facing the light emitting structure. A first raw material in the forming the first inorganic layer includes hydrogen. A second raw material in the performing the first plasma treatment exclusively consists of hydrogen.

20 Claims, 7 Drawing Sheets

DISPLAY DEVICE AND METHOD OF MANUFACTURING THE SAME

This application claims priority to Korean Patent Application No. 10-2021-0011433, filed on Jan. 27, 2021, and all the benefits accruing therefrom under 35 U.S.C. § 119, the content of which in its entirety is herein incorporated by reference.

BACKGROUND

1. Field

Embodiments of the invention relate generally to a display device. More specifically, embodiments of the invention relate to a display device including a thin film encapsulation layer having improved reliability.

2. Discussion of the Related Art

As technology improves, display devices having smaller sizes, lighter weight, and superior performance are being produced. Conventional cathode ray tube ("CRT") televisions have been widely used for display devices with many advantages in terms of performance and price. Display devices such as a plasma display device, a liquid crystal display device, and an organic light emitting display device, possess technology features which overcome weak points of the CRT in terms of miniaturization or portability and have advantages such as miniaturization, light weight, and low power consumption.

The organic light emitting display device may include a thin film encapsulation layer to encapsulate an organic light emitting structure disposed on a base substrate. The thin film encapsulation layer may have a configuration in which an inorganic layer and an organic layer are repeatedly arranged, and efforts are being made to improve the reliability of the thin film encapsulation layer.

SUMMARY

Some embodiments provide a display device including a thin film encapsulation layer having improved reliability.

Some embodiments provide a method of manufacturing the display device.

In an embodiment of the invention, a method of manufacturing a display device includes forming a light emitting structure on a substrate and forming a thin film encapsulation layer on the light emitting structure by chemical vapor deposition equipment. The forming the thin film encapsulation layer includes forming a first inorganic layer and performing a first plasma treatment on a first portion of the first inorganic layer which is opposite to a second portion of the first inorganic layer facing the light emitting structure. A first raw material in the forming the first inorganic layer includes hydrogen. A second raw material in the performing the first plasma treatment exclusively consists of hydrogen.

In an embodiment, the first raw material may further include at least one of silane, ammonia, nitrous oxide, and nitrogen.

In an embodiment, the forming the first inorganic layer and the performing the first plasma treatment may be carried out while maintaining same power, same pressure, same temperature, and same spacing of the chemical vapor deposition equipment.

In an embodiment, the performing the first plasma treatment may be carried out for about 10 seconds to about 30 seconds.

In an embodiment, the forming the thin film encapsulation later may further include forming a second inorganic layer on the first inorganic layer. A third raw material in the forming the second inorganic layer may be identical to the first raw material.

In an embodiment, the forming the thin film encapsulation layer may further include performing a second plasma treatment on a first portion of the second inorganic layer which is opposite to a second portion of the second inorganic layer facing the light emitting structure. A fourth raw material in performing the second plasma treatment may exclusively consist of hydrogen.

In an embodiment, the forming the second inorganic layer and the performing the second plasma treatment may be carried out while maintaining same power, same pressure, same temperature, and same spacing of the chemical vapor deposition equipment.

In an embodiment of the invention, a display device includes a light emitting structure disposed on a substrate and a thin film encapsulation layer disposed on the light emitting structure. The thin film encapsulation layer includes a first inorganic layer, an organic layer disposed on the first inorganic layer, and a second inorganic layer disposed on the organic layer. The upper inorganic layer includes a first-1 inorganic layer including at least one of silicon nitride and silicon oxynitride and a first-2 inorganic layer disposed on the first-1 inorganic layer, including a material identical to a material of the first-1 inorganic layer, and having dangling bonds less than dangling bonds of the first-1 inorganic layer.

In an embodiment, a number of hydrogen atoms included in the first-2 inorganic layer may be greater than a number of hydrogen atoms included in the first-1 inorganic layer.

In an embodiment, the second inorganic layer may have a thickness of about 1200 nanometers (nm) or less.

In an embodiment, the second inorganic layer may have a thickness in a range of about 500 nm to about 700 nm.

In an embodiment, the second inorganic layer may have a thickness smaller than a thickness of the first inorganic layer.

In an embodiment, the first-2 inorganic layer may have a thickness in a range of about 5 nm to about 8 nm.

In an embodiment, the second inorganic layer may be not oxidized under a temperature of about 85 degrees Celsius (° C.) and a humidity of about 85 percent (%) for about 500 hours.

In an embodiment, the second inorganic layer may have a refractive index identical to a refractive index of the first-1 inorganic layer.

In an embodiment, the second inorganic layer may further include a second-1 inorganic layer disposed on the first-2 inorganic layer and including a material identical to a material of the first-1 inorganic layer.

In an embodiment, the second inorganic layer may further include a second-2 inorganic layer disposed on the second-1 inorganic layer, including a material identical to a material of the second-1 inorganic layer, and having dangling bonds less than dangling bonds of the second-1 inorganic layer.

In an embodiment, the second inorganic layer may have a thickness in a range of about 500 nm to about 700 nm and the second-2 inorganic layer may have a thickness in a range of about 5 nm to about 8 nm.

In an embodiment, the first inorganic layer may include a third-1 inorganic layer including at least one of silicon nitride, silicon oxynitride, silicon oxide, aluminum oxide, and titanium oxide and a third-2 inorganic layer disposed on the third-1 inorganic layer, including a material identical to a material of the third-1 inorganic layer, and having dangling bonds less than dangling bonds of the third-1 inorganic layer.

In an embodiment, the third-1 inorganic layer may be not oxidized under a temperature of about 85° C. and a humidity of about 85% for about 500 hours, and the third-2 inorganic layer may be provided by a hydrogen plasma treatment on the first inorganic layer.

Since the forming a thin film encapsulation layer includes at least one of a first plasma treatment and a second plasma treatment, at least some of dangling bonds of a second inorganic layer may be bonded to hydrogen. For this reason, a thickness of the thin film encapsulation layer may be minimized without being oxidized under a temperature of about 85° C. and a humidity of about 85% for about 500 hours. Accordingly, the display device may easily exhibit the flexible property.

The first and second plasma treatments may be performed while maintaining the same power, same pressure, same temperature, and same spacing of the chemical vapor deposition equipment by the same chemical vapor deposition equipment used when forming the inorganic layer. Therefore, different from the process for depositing the inorganic layer of the thin film encapsulation layer into multiple layers having separate inorganic materials, the additional process time may be minimized.

It is to be understood that both the foregoing general description and the following detailed description are examples which are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventions.

DETAILED DESCRIPTION

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 1:
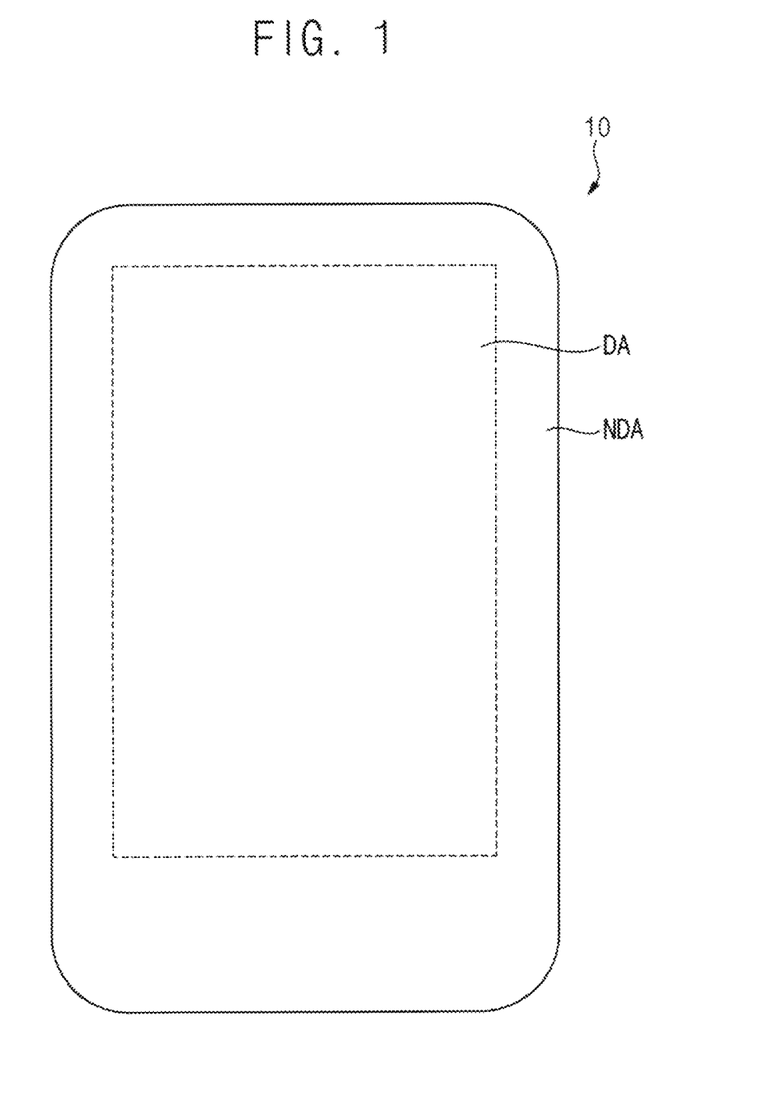
FIG. 1 is a plan view illustrating an embodiment of a display device according to the invention.

FIG. 1 is a plan view illustrating an embodiment of a display device 10 according to the invention.

Referring to FIG. 1, a display device 10 in an embodiment of the invention may be divided into a display area DA and a non-display area NDA.

In an embodiment, a plurality of pixels may be disposed on the display area DA. The plurality of pixels may be arranged in a form of a matrix over the whole display area DA. However, this is an illustrative purpose only, and the plurality of pixels may be arranged in various forms on the display area DA. The display device 10 may display an image on the display area DA through the plurality of pixels. The display device 10 may be an organic light emitting display device. However, this is an illustrative purpose only, and the display device 10 may be a liquid crystal display device, a quantum dot display device, an electrophoretic display device, a plasma display device, or the like.

Drivers (e.g., a gate driver and/or a data driver) may be disposed on the non-display area NDA, and various electronic devices such as an integrated circuit or a printed circuit board may be electrically connected to the non-display area NDA. The non-display area NDA may be disposed to surround the display area DA when viewed in a plan view.

Figure 2:
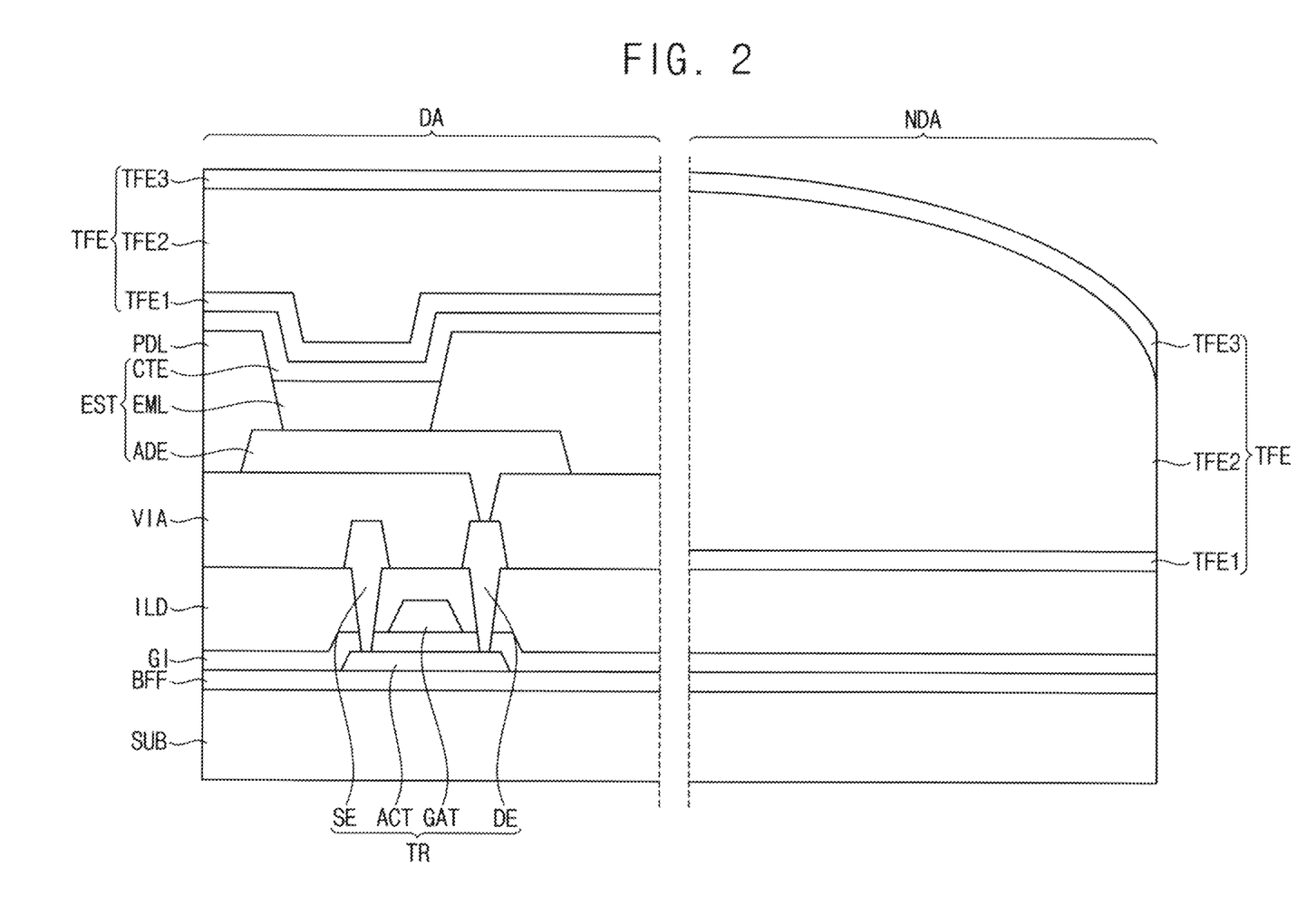
FIG. 2 is a cross-sectional view of the display device shown in FIG. 1.

FIG. 2 is a cross-sectional view of the display device 10 shown in FIG. 1. FIG. 2 illustrates the display area DA and the non-display area NDA of the display device 10.

Referring to FIG. 2, the display device 10 may include a substrate SUB, a buffer layer BFF, a transistor TR, a gate insulating layer GI, an inter-insulating layer ILD, a via-insulating layer VIA, a light emitting structure EST, a pixel defining layer PDL, and a thin film encapsulation layer TFE. The transistor TR and the light emitting structure EST may be disposed on the display area DA. The transistor TR may include an active layer ACT, a gate electrode GAT, a source electrode SE, and a drain electrode DE. The light emitting structure EST may include a lower electrode layer ADE, an intermediate layer EML, and an upper electrode layer CTE.

In an embodiment, the substrate SUB may be a glass substrate, a quartz substrate, a plastic substrate, or the like. When the substrate SUB is the plastic substrate, the substrate SUB may include various materials having flexible, foldable, bendable, or rollable properties. That is, the substrate SUB may include a polymer resin. Examples of the polymer resin may include polyethersulphone ("PES"), polyacrylate ("PAR"), polyetherimide ("PEI"), polyethylene naphthalate ("PEN"), polyethyleneterephthalate ("PET"), polyphenylene sulfide ("PPS"), polyarylate ("PAR"), polyimide ("PI"), polycarbonate ("PC"), and cellulose acetate propionate ("CAP"). These may be used alone or in combination with each other. However, the polymer resin is not limited thereto. In addition, the substrate SUB may have a multilayer structure consisting of two layers including the polymer resin and a barrier layer including an inorganic material interposed between the two layers. Accordingly, the substrate SUB may have a single layer structure or a multilayer structure. Examples of the inorganic material may include silicon oxide ($SiO_x$), silicon nitride ($SiN_x$), and silicon oxynitride ($SiO_xN_y$). These may be used alone or in combination with each other. However, the inorganic material is not limited thereto.

The buffer layer BFF may be disposed on the substrate SUB. The buffer layer BFF may prevent metal atoms or impurities from diffusing from the substrate SUB to the active layer ACT of the transistor TR. In addition, the active layer ACT may be uniformly formed or provided because the buffer layer BFF controls the heat supply rate during the crystallization process for forming the active layer ACT.

The active layer ACT may be disposed on the buffer layer BFF. In an embodiment, the active layer ACT may include a silicon semiconductor. Examples of the silicon semiconductor may include amorphous silicon, polycrystalline silicon, or the like. In another embodiment, the active layer ACT may include an oxide semiconductor. Examples of the oxide semiconductor may include zinc oxide, indium oxide, gallium oxide, tin oxide, titanium oxide, and phosphorus oxide. These may be used alone or in combination with each other. Specifically, the oxide semiconductor may include at least one of zinc oxide, zinc-tin oxide, zinc-indium oxide, indium oxide, titanium oxide, indium-gallium-zinc oxide, and indium-zinc-tin oxide.

The gate insulating layer GI may be disposed on the active layer ACT. The gate insulating layer GI may insulate the active layer ACT from the gate electrode GAT. The gate insulating layer GI may include an insulating material. Examples of the insulating material may include silicon oxide, silicon nitride, titanium oxide, tantalum oxide, or the like.

The gate electrode GAT may be disposed on the gate insulating layer GI. A gate signal for applying an on/off signal to the transistor TR may be applied to the gate electrode GAT. The gate electrode GAT may include metal, an alloy, conductive metal oxide, a transparent conductive material, or the like. In an embodiment, the gate electrode GAT may include silver, an alloy including silver, molybdenum, an alloy including molybdenum, aluminum, an alloy including aluminum, aluminum nitride, tungsten, tungsten nitride, copper, nickel, chromium, chromium nitride, titanium, tantalum, platinum, scandium, indium-tin oxide, indium-zinc oxide, or the like, for example.

The inter-insulating layer ILD may be disposed on the gate electrode GAT. The inter-insulating layer ILD may insulate the gate electrode GAT from the source electrode SE and the drain electrode DE. The inter-insulating layer ILD may include an insulating material. Examples of the insulating material may include silicon oxide, silicon nitride, titanium oxide, tantalum oxide, or the like.

The source electrode SE and the drain electrode DE may be disposed on the inter-insulating layer ILD. When the gate electrode GAT is turned on/off, the source electrode SE may transmit a signal to the drain electrode DE, and the drain electrode DE may transmit a signal to the lower electrode layer ADE. The source electrode SE and the drain electrode DE may contact the active layer ACT through a contact hole defined through the inter-insulating layer ILD and the gate insulating layer GI.

The via-insulating layer VIA may be disposed on the source electrode SE and the drain electrode DE. The via-insulating layer VIA may include an organic insulating material. Examples of the organic insulating material may include photoresist, a polyacrylic resin, a polyimide resin, an acrylic resin, or the like. The via-insulating layer VIA may have a substantially flat top surface. The term "substantially flat" may be exactly flat, or may be flat within acceptable variations that may occur, for example, due to manufacturing processes.

The lower electrode layer ADE may be disposed on the via-insulating layer VIA. The lower electrode layer ADE may include metal, an alloy, conductive metal oxide, a transparent conductive material, or the like. The lower electrode layer ADE may be connected to the drain electrode DE through a contact hole defined through the via-insulating layer VIA. In an embodiment, the lower electrode layer ADE may be used as an anode electrode. In another embodiment, the lower electrode layer ADE may be used as a cathode electrode.

The pixel defining layer PDL may be disposed on the lower electrode layer ADE. The pixel defining layer PDL may define an emission area of each pixel. The pixel defining layer PDL may be an organic insulating layer including an organic material. In an embodiment, the pixel defining layer PDL may include an organic insulating material such as a polyacrylic compound, a polyimide compound, a fluorine-based carbon compound such as Teflon, and a benzocyclobutene compound, for example. An opening that exposes an upper surface of the lower electrode layer ADE may be defined in the pixel defining layer PDL.

The intermediate layer EML may be disposed on the lower electrode layer ADE. The intermediate layer EML may be provided as a single layer, but may be provided as a multilayer including various functional layers. In an embodiment, the intermediate layer EML may have a stack structure in which a hole injection layer, a hole transport layer, an emission layer, an electron transport layer, and an electron injection layer are stacked solely or in combination with each other, for example.

The upper electrode layer CTE may be disposed on the intermediate layer EML. The upper electrode layer CTE may cover the pixel defining layer PDL on the intermediate layer EML. In an embodiment, the upper electrode layer CTE may be used as a cathode electrode. In another embodiment, the upper electrode layer CTE may be used as an anode electrode.

The thin film encapsulation layer TFE may be disposed on the upper electrode layer CTE. The thin film encapsulation layer TFE may prevent the penetration of moisture and oxygen from the outside. The thin film encapsulation layer TFE may include at least one inorganic layer and at least one organic layer. The at least one inorganic layer and the at least one organic layer may be alternately stacked with each other. In an embodiment, the thin film encapsulation layer TFE may include a lower inorganic layer TFE1, an organic layer TFE2 disposed on the lower inorganic layer TFE1, and an upper inorganic layer TFE3 disposed on the organic layer TFE2, but the invention is not limited thereto.

The thin film encapsulation layer may not be able to completely prevent the penetration of moisture and oxygen from the outside. Accordingly, the minimum barrier standard for the thin film encapsulation layer is that the thin film encapsulation layer is not oxidized by external moisture and oxygen under predetermined conditions. In an embodiment, the minimum barrier standard may be that the thin film encapsulation layer is not oxidized under a temperature of about 85 degrees Celsius (° C.) and a humidity of about 85 percent (%) for about 500 hours, for example. In order to satisfy the minimum barrier standard for the thin film encapsulation layer, the thin film encapsulation layer may have a predetermined thickness along a direction (e.g., vertical direction in FIG. 2) perpendicular to a main plane extension direction (e.g., horizontal direction in FIG. 2) of the substrate SUB.

In addition, a flexible display device that may be stored while being folded and rolled has been developed in recent years. The flexible display device may have flexible properties. In an embodiment, the flexible display device may have foldable, bendable, rollable, or stretchable properties, for example. The flexible display device may be generally light in weight and may have strong impact-resistant properties. When the flexible display device is too thick, it may be difficult to exhibit the flexible properties.

Accordingly, a thin film encapsulation layer that satisfies the minimum barrier standard for the thin film encapsulation layer while reducing the thickness thereof may be desired.

Figure 3:
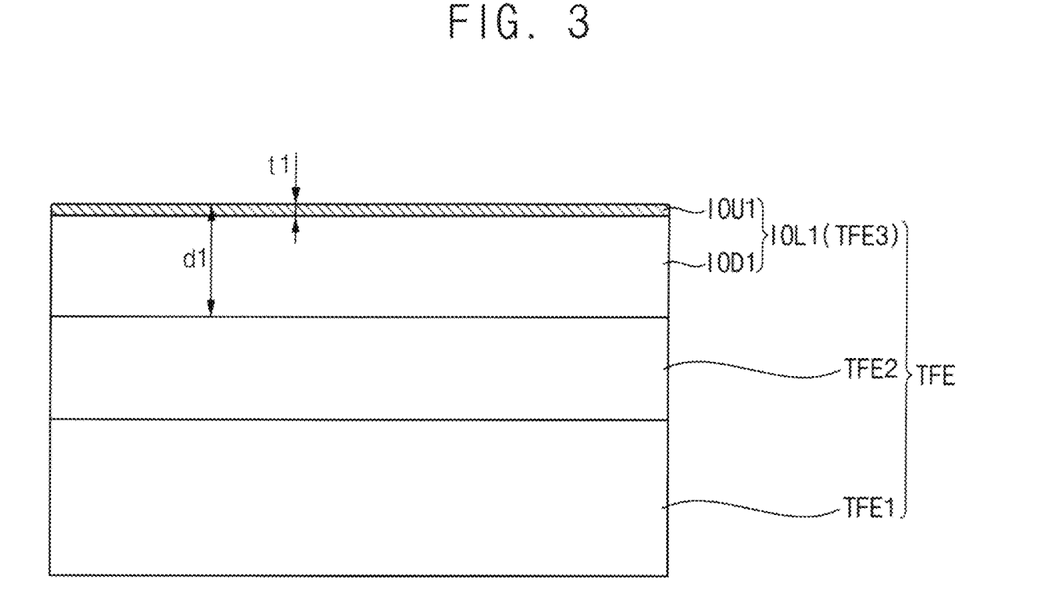
FIG. 3 is a cross-sectional view illustrating an embodiment in which the thin film encapsulation layer shown in FIG. 2 is enlarged.

FIG. 3 is a cross-sectional view illustrating an embodiment in which the thin film encapsulation layer TFE shown in FIG. 2 is enlarged.

Referring to FIG. 3, the thin film encapsulation layer TFE may include a lower inorganic layer TFE1, an organic layer TFE2 disposed on the lower inorganic layer TFE1, and an upper inorganic layer TFE3 disposed on the organic layer TFE2.

The upper inorganic layer TFE3 may include a first-1 inorganic layer IOD1 including at least one of silicon nitride ($SiN_x$) and silicon oxynitride ($SiO_xN_y$), and a first-2 inorganic layer IOU1 disposed on the first-1 inorganic layer IOD1. The first-2 inorganic layer IOU1 may include the same material as that of the first-1 inorganic layer IOD1 and may have dangling bonds less than dangling bonds of the first-1 inorganic layer IOD1. The number of hydrogen atoms included in the first-2 inorganic layer IOU1 may be greater than the number of hydrogen atoms included in the first-1 inorganic layer IOD1. The first-1 inorganic layer IOD1 and the first-2 inorganic layer IOU1 may be collectively defined as a first inorganic layer IOL1. In this case, the first inorganic layer IOL1 may be the upper inorganic layer TFE3.

As the amount of dangling bond increases, external moisture and oxygen may be more easily penetrated into the upper inorganic layer TFE3 of the thin film encapsulation layer TFE. In other words, as the number of dangling bonds increases, the barrier property of the thin film encapsulation layer TFE may decrease. Therefore, the upper inorganic layer TFE3 of the thin film encapsulation layer TFE includes the first-2 inorganic layer IOU1 having a smaller number of dangling bonds, so that the invention may improve the barrier property of the thin film encapsulation layer TFE.

Since the upper inorganic layer TFE3 includes the first-2 inorganic layer IOU1, the upper inorganic layer TFE3 may not be oxidized at a temperature of about 85° C. and a humidity of about 85% for about 500 hours. That is, the upper inorganic layer TFE3 may satisfy the minimum barrier standard.

When the upper inorganic layer TFE3 does not include the first-2 inorganic layer IOU1, the peak of Si—$O_xN_y$ may be lowered in the chemical state of silicon (Si), the peak of $SiN_x$ may also be lowered, and the peak of Si—$O_x$ may become higher over time. When the upper inorganic layer TFE3 includes the first-2 inorganic layer IOU1, the peaks of Si—O$_x$N$_y$ and Si—N$_x$ may not change over time. For this reason, since the upper inorganic layer TFE3 includes the first-2 inorganic layer IOU1, suppression of oxidation may be predicted. That is, since the upper inorganic layer TFE3 includes the first-2 inorganic layer IOU1, the barrier property may be improved.

In addition, since the thin film encapsulation layer TFE includes the first-2 inorganic layer IOU1, the thickness of the thin film encapsulation layer TFE may be reduced. In other words, in the related art, the upper inorganic layer TFE3 has a relatively large thickness in order to satisfy the minimum barrier standard. However, since the barrier property of the thin film encapsulation layer TFE is improved, the minimum barrier standard may be satisfied even when a thickness d1 of the upper inorganic layer TFE3 is not large. That is, the thickness d1 of the upper inorganic layer TFE3 may be reduced. More specifically, the thickness d1 of the upper inorganic layer TFE3 may be about 1200 nanometers (nm) or less. In detail, the thickness d1 of the upper inorganic layer TFE3 may be in the range of about 500 nm to about 700 nm. In addition, the thickness d1 of the upper inorganic layer TFE3 may be smaller than the thickness of the lower inorganic layer TFE1. Accordingly, the thickness of the thin film encapsulation layer TFE may be reduced by reducing the thickness d1 of the upper inorganic layer TFE3. As a result, the thickness of the display device 10 may be reduced, so that the flexible property may be easily exhibited.

In addition, a thickness t1 of the first-2 inorganic layer IOU1 may be substantially thin. Specifically, the thickness t1 of the first-2 inorganic layer IOU1 may be in the range of about 5 nm to about 8 nm. Accordingly, the thickness d1 of the upper inorganic layer TFE3 may be about 1200 nm or less, and specifically, the thickness d1 of the upper inorganic layer TFE3 may be in the range of about 500 nm to about 700 nm, whereas the thickness t1 of the first-2 inorganic layer IOU1 may be in the range of about 5 nm to about 8 nm. Accordingly, the thickness t1 of the first-2 inorganic layer IOU1 may occupy about 5% or less of the thickness d1 of the upper inorganic layer TFE3. Specifically, the thickness t1 of the first-2 inorganic layer IOU1 may occupy only about 0.4% to about 1.6% of the thickness d1 of the upper inorganic layer TFE3. For this reason, the first-2 inorganic layer IOU1 may not affect a film property of the upper inorganic layer TFE3. In other words, the first-2 inorganic layer IOU1 may improve the barrier property of the upper inorganic layer TFE3, but may not change a refractive index. Specifically, a refractive index of the upper inorganic layer TFE3 may be the same as a refractive index of the first-1 inorganic layer IOD1. More specifically, the transmittance of the upper inorganic layer TFE3 may not be lowered even when the upper inorganic layer TFE3 includes the first-2 inorganic layer IOU1. The first-2 inorganic layer IOU1 may be formed or provided by performing a hydrogen plasma treatment on is the first inorganic layer IOL1. The hydrogen plasma treatment will be described below.

Figure 4:
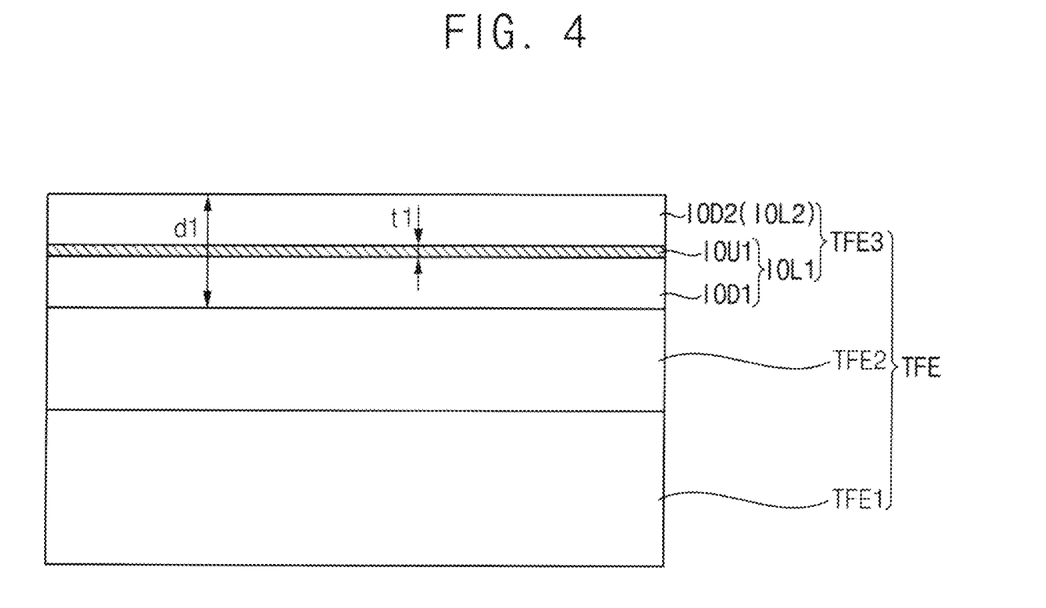
FIG. 4 is a cross-sectional view illustrating another embodiment in which the thin film encapsulation layer shown in FIG. 2 is enlarged.

FIG. 4 is a cross-sectional view illustrating another embodiment in which the thin film encapsulation layer TFE shown in FIG. 2 is enlarged.

Referring to FIG. 4, the thin film encapsulation layer TFE may include a lower inorganic layer TFE1, an organic layer TFE2 disposed on the lower inorganic layer TFE1, and an upper inorganic layer TFE3 disposed on the organic layer TFE2.

The upper inorganic layer TFE3 may include a first-1 inorganic layer IOD1 including at least one of silicon nitride and silicon oxynitride, a first-2 inorganic layer IOU1 disposed on the first-1 inorganic layer IOD1, and a second-1 inorganic layer IOD2 disposed on the first-2 inorganic layer IOU1. The first-2 inorganic layer IOU1 may include the same material as that of the first-1 inorganic layer IOD1 and may have dangling bonds less than dangling bonds of the first-1 inorganic layer IOD1. The second-1 inorganic layer IOD2 may include the same material as that of the first-1 inorganic layer IOD1. In this case, the first-1 inorganic layer IOD1 and the first-2 inorganic layer IOU1 may be collectively defined as a first inorganic layer IOL1 and the second-1 inorganic layer IOD2 may be defined as a second inorganic layer IOL2.

The second-1 inorganic layer IOD2 and the first-1 inorganic layer IOD1 may include substantially the same material as each other. The number of hydrogen atoms included in the first-2 inorganic layer IOU1 may be greater than the number of hydrogen atoms included in the first-1 inorganic layer IOD1. The number of hydrogen atoms included in the first-2 inorganic layer IOU1 may be greater than the number of hydrogen atoms included in the second-1 inorganic layer IOD2. That is, the upper inorganic layer TFE3 of the thin film encapsulation layer TFE according to the embodiment of the invention may include the second-1 inorganic layer IOD2 that includes a smaller number of hydrogen atoms at the top of the upper inorganic layer TFE3, other than the first-2 inorganic layer IOU1 including a larger number of hydrogen atoms.

Figure 5:
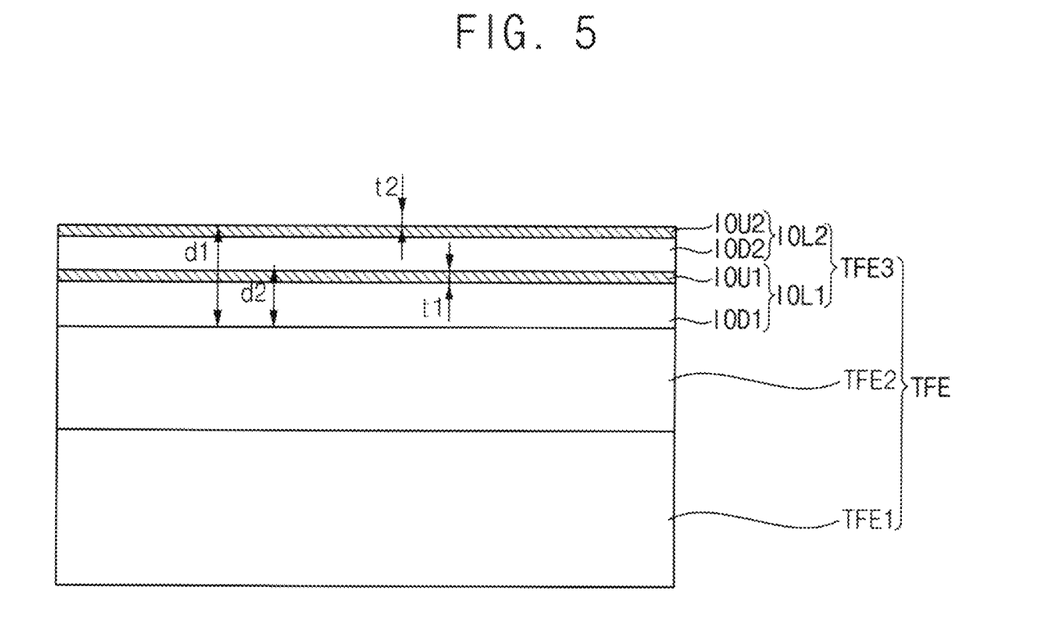
FIG. 5 is a cross-sectional view illustrating another embodiment in which the thin film encapsulation layer shown in FIG. 2 is enlarged.

FIG. 5 is a cross-sectional view illustrating another embodiment in which the thin film encapsulation layer TFE shown in FIG. 2 is enlarged.

Referring to FIG. 5, the thin film encapsulation layer TFE may include a lower inorganic layer TFE1, an organic layer TFE2 disposed on the lower inorganic layer TFE1, and an upper inorganic layer TFE3 disposed on the organic layer TFE2. The upper inorganic layer TFE3 may include a first inorganic layer IOL1 and a second inorganic layer IOL2 disposed on the first inorganic layer IOL1.

The first inorganic layer IOL1 may include a first-1 inorganic layer IOD1 including at least one of silicon nitride and silicon oxynitride and a first-2 inorganic layer IOU1 disposed on the first-1 inorganic layer IOD1. The first-2 inorganic layer IOU1 may include the same material as that of the first-1 inorganic layer IOD1 and may have dangling bonds less than dangling bonds of the first-1 inorganic layer IOD1. The number of hydrogen atoms included in the first-2 inorganic layer IOU1 may be greater than the number of hydrogen atoms included in the first-1 inorganic layer IOD1.

The second inorganic layer IOL2 may include a second-1 inorganic layer IOD2 including at least one of silicon nitride and silicon oxynitride and a second-2 inorganic layer IOU2 disposed on the second-1 inorganic layer IOD2 The second-2 inorganic layer IOU2 may include the same material as that of the second-1 inorganic layer IOD2 and may have dangling bonds less than dangling bonds of the second-1 inorganic layer IOD2. The number of hydrogen atoms included in the second-2 inorganic layer IOU2 may be greater than the number of hydrogen atoms included in the second-1 inorganic layer IOD2.

The second-1 inorganic layer IOD2 may be disposed on the first-2 inorganic layer IOU1 and may include the same material as that of the first-1 inorganic layer IOD1. The upper inorganic layer TFE3 of the thin film encapsulation layer TFE according to the embodiment of the invention includes the second-2 inorganic layer IOU2, thereby reducing a thickness d2 of the first inorganic layer IOU. Accordingly, a thickness d1 of the upper inorganic layer TFE3 may be further reduced. Specifically, the thickness d1 of the upper inorganic layer TFE3 may be in the range of about 500 nm to about 700 nm, and the thickness t2 of the second-2 inorganic layer IOU2 may be in the range of about 5 nm to about 8 nm.

The first-1 inorganic layer IOD1, the first-2 inorganic layer IOU1, the second-1 inorganic layer IOD2, and the second-2 inorganic layer IOU2 may include the same material. In an embodiment, the upper inorganic layer TFE3 may include silicon nitride. In other words, the first-1 inorganic layer IOD1, the first-2 inorganic layer IOU1, the second-1 inorganic layer IOD2, and the second-2 inorganic layer IOU2 may include silicon nitride, for example. Accordingly, the invention may differ from a structure in which the upper inorganic layer has a stack structure of an inorganic layer including silicon nitride and an inorganic layer including silicon oxynitride. However, the invention does not intend to limit that the upper inorganic layer TFE3 and the lower inorganic layer TFE1 include the same material.

The first-1 inorganic layer IOD1 and the second-1 inorganic layer IOD2 may include the same number of dangling bonds as each other, and the first-2 inorganic layer IOU1 and the second-2 inorganic layer IOU2 may include the same number of dangling bonds as each other. Specifically, the dangling bonds included in the first-1 inorganic layer IOD1 and the second-1 inorganic layer IOD2 may be less than the dangling bonds included in the first-2 inorganic layer IOU1 and the second-2 inorganic layer IOU2. In addition, hydrogen atoms included in the first-1 inorganic layer IOD1 and the second-1 inorganic layer IOD2 may be less than hydrogen included in the first-2 inorganic layer IOU1 and the second-2 inorganic layer IOU2. In other words, the first-1 inorganic layer IOD1 and the second-1 inorganic layer IOD2 are substantially the same as each other, and the first-2 inorganic layer IOU1 and the second-2 inorganic layer IOU2 are substantially the same as each other.

That is, the upper inorganic layer TFE3 of the thin film encapsulation layer TFE according to the embodiment of the invention may include an inorganic layer including a larger number of hydrogen atoms (e.g., the first-2 inorganic layer IOU1 and the second-2 inorganic layer IOU2) as a two-layer structure. However, the invention is not limited thereto, and the upper inorganic layer TFE3 of the thin film encapsulation layer TFE may include an inorganic layer including a larger number of hydrogen atoms as a multilayer structure. The second-2 inorganic layer IOU2 may be formed or provided by performing a hydrogen plasma treatment on the second inorganic layer IOL2. The hydrogen plasma treatment will be described below.

Figure 6:
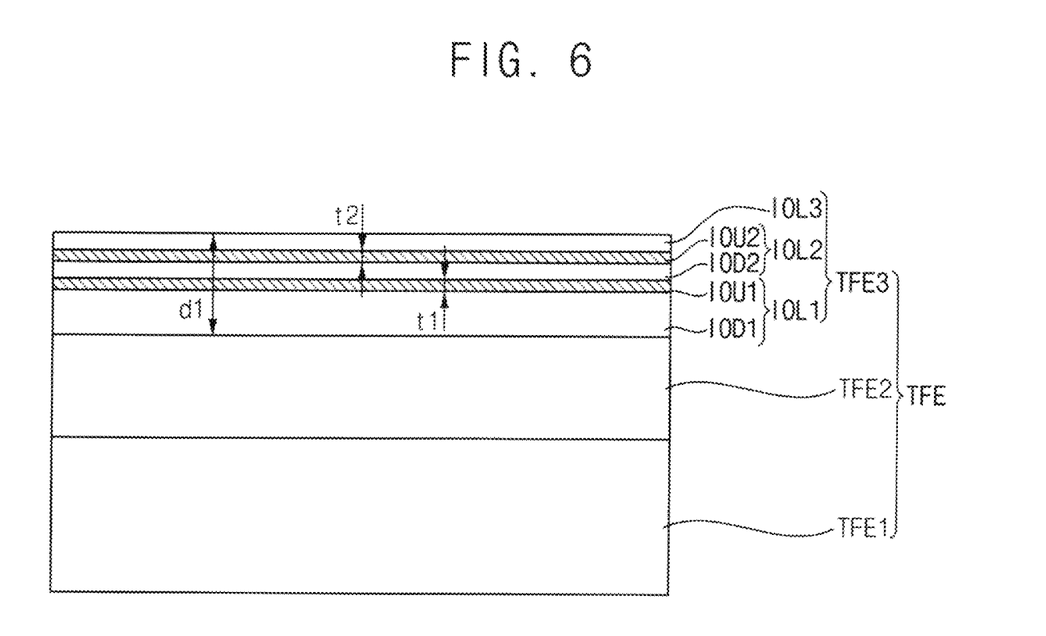
FIG. 6 is a cross-sectional view illustrating another embodiment in which the thin film encapsulation layer shown in FIG. 2 is enlarged.

FIG. 6 is a cross-sectional view illustrating another embodiment in which the thin film encapsulation layer TFE shown in FIG. 2 is enlarged.

Referring to FIG. 6, the thin film encapsulation layer TFE may include a lower inorganic layer TFE1, an organic layer TFE2 disposed on the lower inorganic layer TFE1, and an upper inorganic layer TFE3 disposed on the organic layer TFE2.

The upper inorganic layer TFE3 may further include a third inorganic layer IOL3 disposed on the second-2 inorganic layer IOU2 and including the same material as that of the first-1 inorganic layer IOD1 and the second-1 inorganic layer IOD2. Accordingly, the upper inorganic layer TFE3 of the thin film encapsulation layer TFE may not be an inorganic layer including a larger number of hydrogen atoms (e.g., the first-2 inorganic layer IOU1 and the second-2 inorganic layer IOU2), and the upper inorganic layer TFE3 of the thin film encapsulation layer TFE may include the third inorganic layer IOL3 including a smaller number of hydrogen atoms, such as the first-1 inorganic layer IOD1 and the second-1 inorganic layer IOD2 at the top of the upper inorganic layer TFE3.

Figure 7:
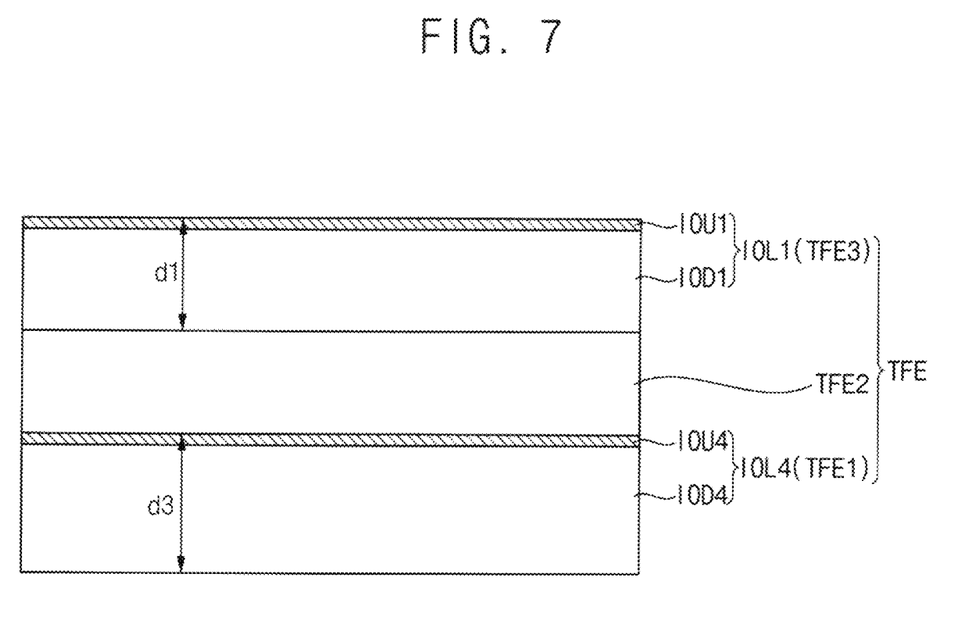
FIG. 7 is a cross-sectional view illustrating another embodiment in which the thin film encapsulation layer shown in FIG. 2 is enlarged.

FIG. 7 is a cross-sectional view illustrating another embodiment in which the thin film encapsulation layer TFE shown in FIG. 2 is enlarged.

Referring to FIG. 7, the thin film encapsulation layer TFE may include a lower inorganic layer TFE1, an organic layer TFE2 disposed on the lower inorganic layer TFE1, and an upper inorganic layer TFE3 disposed on the organic layer TFE2.

The lower inorganic layer TFE1 may include a third-1 inorganic layer IOD4 including at least one of silicon nitride ($SiN_x$), silicon oxynitride ($SiO_xN_y$), silicon oxide ($SiO_x$), aluminum oxide ($AlO_x$), and titanium oxide ($TiO_x$), and a third-2 inorganic layer IOU4 disposed on the third-1 inorganic layer IOD4. The third-2 inorganic layer IOU4 may include the same material as that of the third-1 inorganic layer IOD4 and may have dangling bonds less than dangling bonds of the third-1 inorganic layer IOD4. The third-1 inorganic layer IOD4 and the third-2 inorganic layer IOU4 may be collectively defined as a fourth inorganic layer IOL4.

Since the lower inorganic layer TFE1 includes the third-2 inorganic layer IOU4, the third-1 inorganic layer IOD4 may not be oxidized under a temperature of about 85° C. and a humidity of about 85% for about 500 hours. In addition, the third-2 inorganic layer IOU4 may be formed or provided by performing a hydrogen plasma treatment on the lower inorganic layer TFE1. The hydrogen plasma treatment will be described below.

The upper inorganic layer TFE3 includes the first-2 inorganic layer IOU1, so that the thickness d1 of the upper inorganic layer TFE3 may be reduced, and the lower inorganic layer TFE1 includes the third-2 inorganic layer IOU4, so that the thickness d3 of the lower inorganic is layer TFE1 may be reduced. Therefore, the thickness of the thin film encapsulation layer TFE may be minimized while satisfying the minimum barrier standard of the thin film encapsulation layer TFE, so the flexible property may be easily exhibited.

Figure 8:
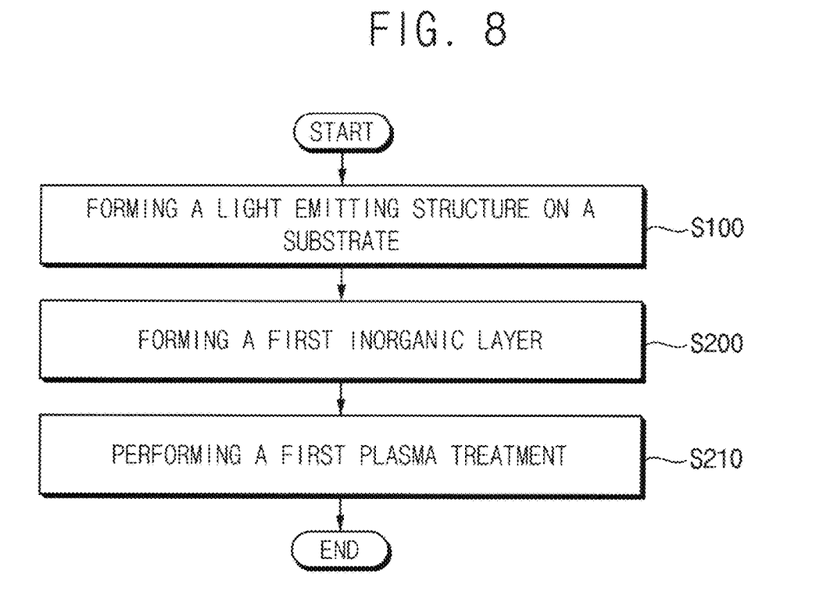
FIG. 8 is a flowchart illustrating an embodiment of a method of manufacturing a display device.

FIG. 8 is a flowchart illustrating an embodiment of a method of manufacturing a display device.

Referring to FIGS. 2, 3, and 8, the method of manufacturing the display device 10 may include forming a light emitting structure EST on a substrate SUB (S100) and forming a thin film encapsulation layer TFE on the light emitting structure EST by chemical vapor deposition equipment, in which the forming the thin film encapsulation layer TFE may include forming a first inorganic layer IOL1 (S200) and performing a first plasma treatment on an upper portion of the first inorganic layer IOL1 (S210).

In the forming the light emitting structure EST on the substrate SUB (S100), the light emitting structure EST including a lower electrode layer ADE (e.g., an anode electrode), an intermediate layer EML, and an upper electrode layer CTE (e.g., a cathode electrode) may be formed or provided after a buffer layer BFF, at least one transistor TR, and at least one insulating layer have been formed or provided on the substrate SUB.

The forming the thin film encapsulation layer TFE may further include forming a lower inorganic layer TFE1 and forming an organic layer TFE2 on the lower inorganic layer TFE1, before the forming the first inorganic layer IOL1 (S200).

The forming the first inorganic layer IOL1 (S200) may be performed by injecting a raw material into the chemical vapor deposition equipment, and setting power, pressure, temperature, and spacing of the chemical vapor deposition equipment. The setting may be performed depending on whether the first inorganic layer IOL1 includes silicon nitride or silicon oxynitride. The spacing may be a distance from a location where a deposition material of the chemical vapor deposition equipment is sprayed to a location where deposition material is deposited.

A first raw material in the forming the first inorganic layer IOL1 (S200) may include hydrogen (H2). In addition, the first raw material may further include at least one of silane ($SiH_4$), ammonia ($NH_3$), nitrous oxide ($N_2O$), and nitrogen ($N_2$).

In the performing the first plasma treatment on the upper portion of the first inorganic layer IOL1 (S210), the upper portion of the first inorganic layer IOL1 may be converted into the first-2 inorganic layer IOU1. A second raw material in the performing the first plasma treatment (S210) may exclusively consist of hydrogen. That is, the performing the first plasma treatment (S210) may be the performing a hydrogen plasma treatment. In other words, the performing the first plasma treatment (S210) may not be an operation of newly depositing a material different from the first inorganic layer IOL1, but an operation of converting a part of the upper portion of the first inorganic layer IOU. That is, it may be different from an operation of depositing another inorganic layer by changing the ratio of gases such as hydrogen, silane, ammonia, nitrous oxide, and nitrogen in the chemical vapor deposition equipment.

The performing the first plasma treatment (S210) may divide the first inorganic layer IOL1 into a first-1 inorganic layer IOD1, which is not affected by the hydrogen plasma, and a first-2 inorganic layer IOU1, which is affected by the hydrogen plasma. In more detail, at least some of the dangling bonds included in the first inorganic layer IOL1 may be bonded to hydrogen through the performing the first plasma treatment (S210). That is, by the performing the first plasma treatment (S210), the first inorganic layer IOL1 may be divided into the first-1 inorganic layer IOD1 and the first-2 inorganic layer IOU1 based on a boundary where the dangling bonds of the first inorganic layer IOL1 bonded with hydrogen exist.

Accordingly, different from FIGS. 3 to 7 where the boundary between the first-1 inorganic layer IOD1 and the first-2 inorganic layer IOU1 is illustrated in a straight line, the boundary may not be a straight line and it is enough when the boundary has a shape of a horizontal axis as a whole.

The forming the first inorganic layer IOL1 (S200) and the performing the first plasma treatment (S210) may be carried out while maintaining the same power, same pressure, same temperature, and same spacing of the chemical vapor deposition equipment. Therefore, excessive process time may not be added.

In addition, the thickness of the first-2 inorganic layer IOU1 may increase as the performing the first plasma treatment (S210) is progressed. Accordingly, as described above, the thickness of the first-2 inorganic layer IOU1 is set to about 5 nm to about 8 nm, and in order to prevent excessive process time, the performing the first plasma treatment (S210) may be carried out for about 10 seconds to about 30 seconds (preferably, about 15 seconds to about 20 seconds). As a result, it is possible to form the first-2 inorganic layer IOU1 that satisfies the minimum barrier standard while minimizing an additional process time.

In other words, the performing the first plasma treatment (S210) may be carried out by the chemical vapor deposition equipment, which is used in the forming the first inorganic layer IOL1, with the same power, same pressure, same temperature, and same spacing, and the first plasma treatment may be performed for about 15 seconds to about 20 seconds by exclusively using hydrogen as a raw material, so that the first-2 inorganic layer IOU1 having excellent barrier properties may be formed or provided while minimizing the additional process time.

Figure 9:
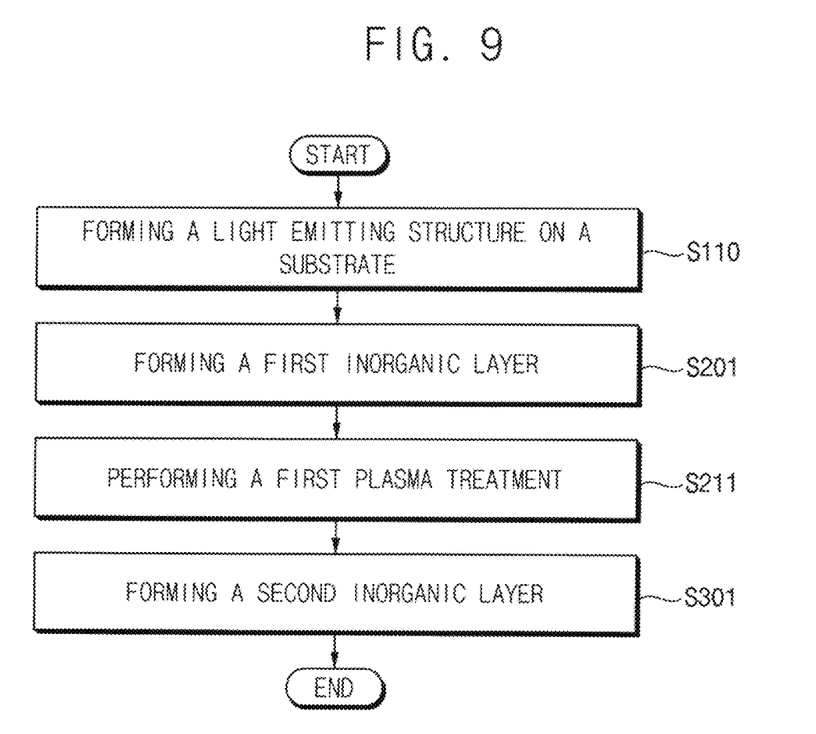
FIG. 9 is a flowchart illustrating an embodiment of a method of manufacturing a display device according to the invention.

FIG. 9 is a flowchart illustrating another embodiment of a method of manufacturing a display device according to the invention.

Referring to FIGS. 2, 4, and 9, the method of manufacturing the display device 10 may include forming a light emitting structure EST on a substrate SUB (S110) and forming a thin film encapsulation layer TFE on the light emitting structure EST by chemical vapor deposition equipment, in which the forming the thin film encapsulation layer TFE may include forming a first inorganic layer IOL1 (S201), performing a first plasma treatment on an upper portion of the first inorganic layer IOL1 (S211), and forming a second inorganic layer IOL2 (S301).

A third raw material used in the forming the second inorganic layer IOL2 may be the same as the first raw material. In other words, the third raw material may include hydrogen, and may further include at least one of silane, ammonia, nitrous oxide, and nitrogen. For this reason, the first inorganic layer IOL1 and the second inorganic layer IOL2 may include the same material. In an embodiment, when the first inorganic layer IOL1 includes silicon nitride, the second inorganic layer IOL2 may also include silicon nitride, for example. In addition, when the first inorganic layer IOL1 includes silicon oxynitride, the second inorganic layer IOL2 may also include silicon oxynitride.

Figure 10:
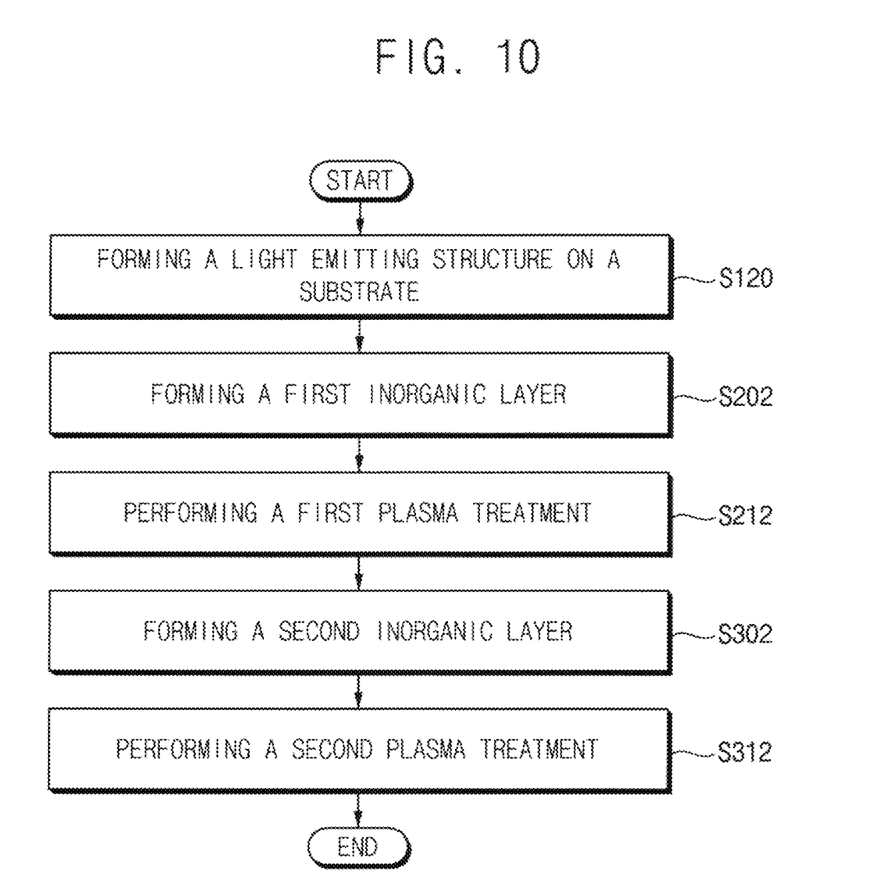
FIG. 10 is a flowchart illustrating an embodiment of a method of manufacturing a display device according to the invention.

FIG. 10 is a flowchart illustrating another embodiment of a method of manufacturing a display device according to the invention.

Referring to FIGS. 2, 5, and 10, the method of manufacturing the display device 10 may include forming a light emitting structure EST on a substrate SUB (S120) and forming a thin film encapsulation layer TFE on the light emitting structure EST by chemical vapor deposition equipment, in which the forming the thin film encapsulation layer TFE may include forming a first inorganic layer IOL1 (S202), performing a first plasma treatment on an upper portion of the first inorganic layer IOL1 (S212), forming a second inorganic layer IOL2 (S302), and performing a second plasma treatment on an upper portion of the second inorganic layer IOL2 (S312).

In the performing the second plasma treatment on the second inorganic layer IOL2 (S312), an upper portion of the second inorganic layer IOL2 may be converted into the second-2 inorganic layer IOU2. A fourth raw material used in the performing the second plasma treatment (S312) may exclusively consist of hydrogen. That is, the performing the second plasma treatment (S312) may be the performing a hydrogen plasma treatment. In other words, the performing the second plasma treatment (S312) may not be an operation of newly depositing a material different from the second inorganic layer IOL2, but is an operation of converting a part of an upper portion of the second inorganic layer IOL2. That is, it may be different from an operation of depositing another inorganic layer by changing the ratio of gases such as hydrogen, silane, ammonia, nitrous oxide, and nitrogen in the chemical vapor deposition equipment.

The performing the second plasma treatment (S312) may divide the second inorganic layer IOL2 into a second-1 inorganic layer IOD2, which is not affected by the hydrogen plasma, and a second-2 inorganic layer IOU2, which is affected by the hydrogen plasma. In more detail, at least some of the dangling bonds included in the second inorganic layer IOL2 may be bonded to hydrogen through the performing the first plasma treatment (S312). That is, by the performing the first plasma treatment (S312), the second inorganic layer IOL2 may be divided into the second-1 inorganic layer IOD2 and the second-2 inorganic layer IOU2 based on a boundary where the dangling bonds of the second inorganic layer IOL2 bonded with hydrogen exist. Accordingly, different from FIGS. 3 to 7 where the boundary is illustrated in a straight line, the boundary may not be a straight line and it is enough when the boundary has a shape of a horizontal axis as a whole.

The forming the second inorganic layer IOL2 (S302) and the performing the second plasma treatment (S312) may be carried out while maintaining the same power, pressure, temperature, and spacing of the chemical vapor deposition equipment. Therefore, excessive process time may not be added.

In addition, the thickness of the second-2 inorganic layer IOU2 may increase as the performing the second plasma treatment (S312) is progressed. In order to prevent excessive process time, the performing the second plasma treatment (S312) may be carried out for about 10 seconds to about 30 seconds. As described above, the minimum barrier standard of the thin film encapsulation layer TFE may be satisfied when the second-2 inorganic layer IOU2 has a thickness in the range of about 5 nm to about 8 nm. Thus, the performing the second plasma treatment (S312) may be carried out for about 15 seconds to about 20 seconds in order to allow the second-2 inorganic layer IOU2 to have a thickness in the range of about 5 nm to about 8 nm. As a result, it is possible to minimize an additional process time.

In other words, the performing the second plasma treatment (S312) may be carried out by the chemical vapor deposition equipment, which is used in the forming the second inorganic layer IOL2, with the same power, same pressure, same temperature, and same spacing, and the second plasma treatment may be performed for about 15 seconds to about 20 seconds by exclusively using hydrogen as a raw material, so that the second-2 inorganic layer IOU2 having excellent barrier properties may be formed or provided while minimizing the additional process time.

Although certain embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:
   forming a light emitting structure on a substrate; and
   forming a thin film encapsulation layer on the light emitting structure by chemical vapor deposition equipment, the forming the thin film encapsulation layer including:
     forming a first inorganic layer; and
     forming a first-1 inorganic layer and a first-2 inorganic layer disposed on the first-1 inorganic layer by performing a first plasma treatment on a first portion of the first inorganic layer which is opposite to a second portion of the first inorganic layer facing the light emitting structure, and
   wherein a first raw material in the forming the first inorganic layer includes hydrogen ($H_2$), and a second raw material in the performing the first plasma treatment exclusively consists of hydrogen, and
   the first-2 inorganic layer includes a material identical to a material of the first-1 inorganic layer and has dangling bonds less than dangling bonds of the first-1 inorganic layer.

2. The method of claim 1, wherein the first raw material further includes at least one of silane ($SiH_4$), ammonia ($NH_3$), nitrous oxide ($N_2O$), and nitrogen ($N_2$).

3. The method of claim 1, wherein the forming the first inorganic layer and the performing the first plasma treatment are carried out while maintaining same power, same pressure, same temperature, and same spacing of the chemical vapor deposition equipment.

4. The method of claim 1, wherein the performing the first plasma treatment is carried out for about 10 seconds to about 30 seconds.

5. The method of claim 1,
   the forming the thin film encapsulation layer further includes forming a second inorganic layer on the first inorganic layer,
   wherein a third raw material in the forming the second inorganic layer is identical to the first raw material.

6. The method of claim 5,
   the forming the thin film encapsulation layer further includes performing a second plasma treatment on a first portion of the second inorganic layer which is opposite to a second portion of the second inorganic layer facing the light emitting structure,
   wherein a fourth raw material in performing the second plasma treatment exclusively consists of hydrogen.

7. The method of claim 6, wherein the forming the second inorganic layer and the performing the second plasma treatment are carried out while maintaining same power, same pressure, same temperature, and same spacing of the chemical vapor deposition equipment.

8. A display device comprising:
   a light emitting structure disposed on a substrate; and
   a thin film encapsulation layer disposed on the light emitting structure and including:
     a first inorganic layer;
     an organic layer disposed on the first inorganic layer; and
     a second inorganic layer disposed on the organic layer and including:
       a first-1 inorganic layer including at least one of silicon nitride and silicon oxynitride; and
       a first-2 inorganic layer disposed on the first-1 inorganic layer, including a material identical to a material of the first-1 inorganic layer, and having dangling bonds less than dangling bonds of the first-1 inorganic layer.

9. The display device of claim 8, wherein a number of hydrogen atoms included in the first-2 inorganic layer is greater than a number of hydrogen atoms included in the first-1 inorganic layer.

10. The display device of claim 8, wherein the second inorganic layer has a thickness of about 1200 nanometers or less.

11. The display device of claim 8, wherein the second inorganic layer has a thickness in a range of about 500 nanometers to about 700 nanometers.

12. The display device of claim 8, wherein the second inorganic layer has a thickness smaller than a thickness of the first inorganic layer.

13. The display device of claim 8, wherein the first-2 inorganic layer has a thickness in a range of about 5 nanometers to about 8 nanometers.

14. The display device of claim 8, wherein the second inorganic layer is not oxidized under a temperature of about 85 degrees Celsius and a humidity of about 85 percent for about 500 hours.

15. The display device of claim 8, wherein the second inorganic layer has a refractive index identical to a refractive index of the first-1 inorganic layer.

16. The display device of claim 8,
the second inorganic layer further includes a second-1 inorganic layer disposed on the first-2 inorganic layer and including a material identical to a material of the first-1 inorganic layer.

17. The display device of claim 16,
the second inorganic layer further includes a second-2 inorganic layer disposed on the second-1 inorganic layer, including a material identical to a material of the second-1 inorganic layer, and having dangling bonds less than dangling bonds of the second-1 inorganic layer.

18. The display device of claim 17, wherein the second inorganic layer has a thickness in a range of about 500 nanometers to about 700 nanometers and the second-2 inorganic layer has a thickness in a range of about 5 nanometers to about 8 nanometers.

19. The display device of claim 8, wherein the first inorganic layer includes:
a third-1 inorganic layer including at least one of silicon nitride ($SiN_x$), silicon oxynitride ($SiO_xN_y$), silicon oxide ($SiO_x$), aluminum oxide ($AlO_x$), and titanium oxide ($TiO_x$); and
a third-2 inorganic layer disposed on the third-1 inorganic layer, including a material identical to a material of the third-1 inorganic layer, and having dangling bonds less than dangling bonds of the third-1 inorganic layer.

20. The display device of claim 19, wherein the third-1 inorganic layer is not oxidized under a temperature of about 85 degrees Celsius and a humidity of about 85 percent for about 500 hours, and the third-2 inorganic layer is provided by a hydrogen plasma treatment on the first inorganic layer.

* * * * *